United States Patent [19]

Natsume

[11] Patent Number: 5,391,906
[45] Date of Patent: Feb. 21, 1995

[54] SEMICONDUCTOR DEVICE PROVIDED WITH CAPACITOR

[75] Inventor: Kiyoshi Natsume, Shizuoka, Japan

[73] Assignee: Yamaha Corporation, Tokyo, Japan

[21] Appl. No.: 263,811

[22] Filed: Jun. 22, 1994

Related U.S. Application Data

[62] Division of Ser. No. 102,586, Aug. 5, 1993, Pat. No. 5,356,826.

[30] Foreign Application Priority Data

Aug. 7, 1992 [JP] Japan .................. 4-211812

[51] Int. Cl.$^6$ ............... H01L 27/02; H01L 23/46; H01L 23/48
[52] U.S. Cl. ............... 257/379; 257/412; 257/755; 257/768
[58] Field of Search ............ 257/379, 412, 306, 368, 257/384, 755, 768

[56] References Cited

U.S. PATENT DOCUMENTS 5,187,122  2/1993  Bonis .................. 437/200

FOREIGN PATENT DOCUMENTS 57-45967  3/1682  Japan .................. 257/379
58-148443  9/1983  Japan .................. 257/379

OTHER PUBLICATIONS

Chow et al., "Refractory MoSi$_2$ and MoSi$_2$/Polysilicon Bulk CMOS Circuits" IEEE Elec. Dev. Let., vol. ED-L-3, No. 2 Feb. 1992 pp. 37–40.

Allan, "Thin-film devices on silicon chip withstand up to 500° C." Electronics Review, Jan. 3, 1980 vol. 53 No. 1 pp. 36–40.

*Primary Examiner*—Jerome Jackson
*Assistant Examiner*—Donald L. Monin, Jr.
*Attorney, Agent, or Firm*—Ostrolenk, Faber, Gerb & Soffen

[57] ABSTRACT

A semiconductor integrated circuit including a MOSFET having a polycide gate structure, a resistor and a capacitor thereon is manufactured. Polycrystalline silicon film and a dielectric film are consecutively deposited. After processes of patterning and etching the dielectric film, the remaining dielectric films are used as a etching protection mask for the resistor and a capacitor insulating film for the capacitor. Then, a refractory metal silicide for a polycide gate is uniformly deposited over the remaining dielectric films. Then, the refractory metal silicide and polycrystalline silicon are consecutively etched over a patterned resist and the remaining dielectric films to simultaneously form the polycide gate, resistor and capacitor. Thus, a resistor having a precise resistance value is manufactured in a MOSFET device having a polycide gate without excessive steps.

16 Claims, 5 Drawing Sheets

SEMICONDUCTOR DEVICE PROVIDED WITH CAPACITOR

This is a division of application Ser. No. 08/102,586, filed Aug. 5, 1993, now U.S. Pat. No. 5,356,826.

BACKGROUND OF THE INVENTION a) Field of the Invention

The present invention relates to a semiconductor device and a method of manufacturing the same, and more particularly to such a device and a method suitable for analog MOS integrated circuits.

b) Description of the Related Art

Analog integrated circuits are known in which active elements such as MOSFETs (field effect transistors of a metal—oxide film—semiconductor structure) and passive elements such as capacitors and resistors are formed on a semiconductor substrate, with the elements being interconnected by a metal wiring pattern. Conventionally, in forming capacitors and resistors on the semiconductor substrate of an analog integrated circuit of this type, the following methods have been used.

Capacitor Forming Methods

Method 1: The lower electrode of a capacitor is formed by using the same material as the gate electrode (hereinafter called gate material) such as polycrystalline silicon or polycide (a laminated layer of polycrystalline silicon and silicidized metal). Next, the lower electrode is covered with a dielectric film serving as a capacitor insulating layer. An upper electrode is then formed on the capacitor insulating layer, opposing the lower electrode.

Method 2: A semiconductor substrate is used as the lower electrode of a capacitor. Namely, after a gate oxide film and field oxide film is grown on the substrate surface, the gate material layer is deposited on the oxide film and selectively etched to form the gate electrode and the upper electrode of the capacitor at the same time.

Method 3: An interlayer insulating film for multilayer wiring is used as a dielectric film of a capacitor. Namely, after the lower electrode of the capacitor is formed with the same layer as the gate electrode, an interlayer insulating film is formed on the whole surface of the substrate. The upper electrode of metal or gate material is formed on the interlayer insulating film, opposing the lower electrode. In the case of an integrated circuit using a two-layer wiring process, the lower electrode of a capacitor is formed by using the lower metal wiring layer, and the upper electrode is formed on the interlayer insulating film by using the upper metal wiring layer, opposing the lower electrode.

Resistor Forming Methods

Method 4: The diffusion region serving as a resistor is formed at the same time when source and drain diffusion regions of a MOSFET are formed on the surface of a semiconductor substrate.

Method 5: For a CMOS integrated circuit, a well region is used as a resistor.

Method 6: A gate electrode layer is patterned to form a resistor.

The above methods are associated with the following disadvantages:

Method 1: After the gate electrode is formed, a capacitor insulating film having a sufficient thickness is formed and then the upper electrode is formed thereon. Therefore, the number of additional steps required for forming the capacitor increases, resulting in a high manufacturing cost. Further, a thermal oxide film is used in these additional steps for performing a capacitor element. This thermal oxide film is usually formed in a high temperature atmosphere of usually 1000°–1100° C. In this thermal treatment, impurities doped for forming source/drain of the MOSFET are caused to diffuse to thereby vary the electric characteristics from the desired ones, such as the change of the threshold voltage.

Method 2: Because the semiconductor substrate is used as the lower electrode, the potential of the electrode is fixed to the substrate potential. Therefore, this method is applicable only to the capacitor whose one of the electrode is connected to a power source or ground line. As the result, freedom of layout of circuit elements is restricted. Namely, the freedom of design such as the layout of elements and wiring becomes low. If the gate oxide film or field oxide film is thick and the required capacitance is large, the area occupied by the capacitor becomes very large.

Method 3: If the thickness of the interlayer insulating film is not proper, the area occupied by the capacitor becomes very large like Method 2. The interlayer insulating film is generally subjected to a flattening process, so that the film thickness is not always uniform. Furthermore, parasitic capacitance may appear unless wirings are properly set, so that pattern design is difficult.

Methods 4 and 5: Both the methods use a diffusion region as a resistor. As a result, a large parasitic capacitance between the diffusion region and semiconductor substrate is added to the resistor, adversely affecting the operation of the circuit laving such a resistor.

Method 6: To prevent an increase in gate resistance due to a short gate length, polycide is used as the gate material. However, the resistance value of polycide is difficult to be controlled precisely.

SUMMARY OF THE INVENTION

It is an object of the present invention to provide a semi, conductor device having MOSFETs, capacitors, and resistors, capable of being manufactured without complicating the manufacturing processes too much, without increasing the manufacturing cost, and without sacrificing the electric properties of the circuit elements.

According to one aspect of the present invention, there is provided a semiconductor integrated circuit including: a thin insulating film and a thick insulating film formed on the surface of a semiconductor substrate; a gate electrode formed on the thin insulating film, the gate electrode having a laminated structure of a polycrystalline silicon layer and a silicide layer; a capacitor element formed on the thick insulating film, the capacitor element having a laminated structure of the polycrystalline silicon layer, a capacitor insulating film, and the silicide layer; and a resistor element formed on the thick insulating film, the resistor element having a laminated structure of the polycrystalline silicon layer and the capacitor insulating film.

According to another aspect of the present invention, there is provided a method of manufacturing a semiconductor device having at least a MOSFET and a capacitor element formed on the surface of a semiconductor substrate, including the steps of: (a) forming a gate oxide film on the surface of the semiconductor substrate; (b) forming a polycrystalline silicon layer on the gate oxide film; (c) forming a capacitor insulating film on the polycrystalline silicon layer; (d) removing the capacitor insulating film while leaving unremoved the area where the capacitor element is formed; (e) forming a refractory material layer covering the polycrystalline silicon layer and the capacitor insulating film; (f) forming a masking member covering the refractory material layer at the areas corresponding to the upper electrode of the capacitor element and the gate electrode of the MOSFET; and (g) removing the refractory material layer at an area other than the areas corresponding to the upper electrode and the gate electrode and removing the polycrystalline silicon layer not covered with the capacitor insulating film, by using the mask member as an etching mask and the capacitor insulating film as an etching stopper, wherein the gate electrode of the MOSFET has a polycide structure of the polycrystalline silicon layer and the refractory material layer, and the capacitor element has the structure of the capacitor insulating film sandwiched between the polycrystalline silicon layer and the refractory material layer.

According to a further aspect of the present invention, there is provided a method of manufacturing a semiconductor device having at least a MOSFET and a resistor element formed on the surface of a semiconductor substrate, including the steps of: (a) forming a gate oxide film on the surface of the semiconductor substrate; (b) forming a polycrystalline silicon layer on the gate oxide film; (c) forming an insulating material layer on the polycrystalline silicon layer; (d) removing the insulating material layer while leaving unremoved the area where the resistor element is formed; (e) forming a refractory material layer covering the polycrystalline silicon layer and the insulating material layer; (f) forming a masking member covering the refractory material layer at the area corresponding to the gate electrode of the MOSFET; and (g) removing the refractory material layer at an area other than the area corresponding to the gate electrode and removing the polycrystalline silicon layer not covered with the insulating material layer, by using the mask member as an etching mask and the insulating material layer as an etching stopper, wherein the gate electrode of the MOSFET has a polycide structure of the polycrystalline silicon layer arid said refractory material layer, and the resistor element made of the polycrystalline silicon layer.

According to a still further aspect of the present invention, there is provided a method of manufacturing a semiconductor device having at least a MOSFET, a capacitor element, and a resistor formed on the surface of a semiconductor substrate, including the steps of: (a) forming a gate oxide film on the surface of the semiconductor substrate; (b) forming a polycrystalline silicon layer on the gate oxide film; (c) forming a capacitor insulating film on the polycrystalline silicon layer; (d) removing the capacitor insulating film while leaving unremoved the areas where the capacitor element and the resistor element are formed; (e) forming a refractory material layer covering the polycrystalline silicon layer and the capacitor insulating film; (f) forming a masking member covering the refractory material layer at the areas corresponding to the upper electrode of the capacitor element and the gate electrode of the MOSFET; and (g) removing the refractory material layer at an area other than the areas corresponding to the upper electrode and the gate electrode and removing the polycrystalline silicon layer not covered with the capacitor insulating film, by using the mask member as an etching mask and the capacitor insulating film as an etching stopper, wherein the gate electrode of the MOSFET has a polycide structure of the polycrystalline silicon layer and the refractory material layer, the capacitor element has the structure of the capacitor insulating film sandwiched between the polycrystalline silicon layer and the refractory material layer, and the resistor element is made of the polycrystalline silicon layer.

It is possible to form a gate electrode having a polycide structure of a polycrystalline silicon layer and a refractory material layer, a capacitor element having a capacitor insulating film sandwiched between the polycrystalline silicon layer and the refractory material layer, and a resistor element made of a single layer of the polycrystalline silicon layer.

It is therefore possible to easily manufacture a semiconductor device having MOSFETs, capacitors, and resistors, without complicating the manufacturing processes too much. without increasing the manufacturing cost, and without sacrificing the electric properties of the circuit elements.

In accordance with the present invention, a semiconductor device comprises: a semiconductor substrate having a gate region thereon and a field insulating film thereon; a field effect transistor formed in the gate region, the field effect transistor having a gate electrode comprising polycrystalline silicon and refractory metal silicide layers; a resistor element formed on the field insulating film, the resistor element comprising a polycrystalline silicon layer having a first thickness and a dielectric film having a second thickness therein; a capacitor element formed on the field insulating film, the capacitor element comprising: an lower electrode layer comprising a polycrystalline silicon layer having a thickness identical to the first thickness of the resistor element; a dielectric layer having a thick and thin portions, wherein the thin portion having a thickness identical to the second thickness of the dielectric film formed on the resistor element; and an upper electrode layer comprising a refractory metal silicide layer.

The invention further comprises a semiconductor device formed on a semiconductor substrate having a gate region thereon and a field insulating film thereon comprising: a field effect transistor formed in the gate region, the field effect transistor having a gate electrode comprising polycrystalline silicon and refractory metal silicide layers; a first analog element formed on the field insulating film, the first analog element comprising a first conductive layer and a dielectric film thereon; a second analog element formed on the field insulating film, the second analog element comprising: an lower electrode layer comprising a polycrystalline silicon layer coplanar to the top surface of the first conductive layer on the first analog element; a dielectric layer having a thick and thin portions, wherein the thin portion being coplanar to the dielectric film of the first analog element; and an upper electrode layer comprising a refractory metal silicide layer.

DETAILED DESCRIPTION OF THE PREFERRED EMBODIMENTS

Embodiments of the invention will be described with reference to the accompanying drawings.

Figure 1:
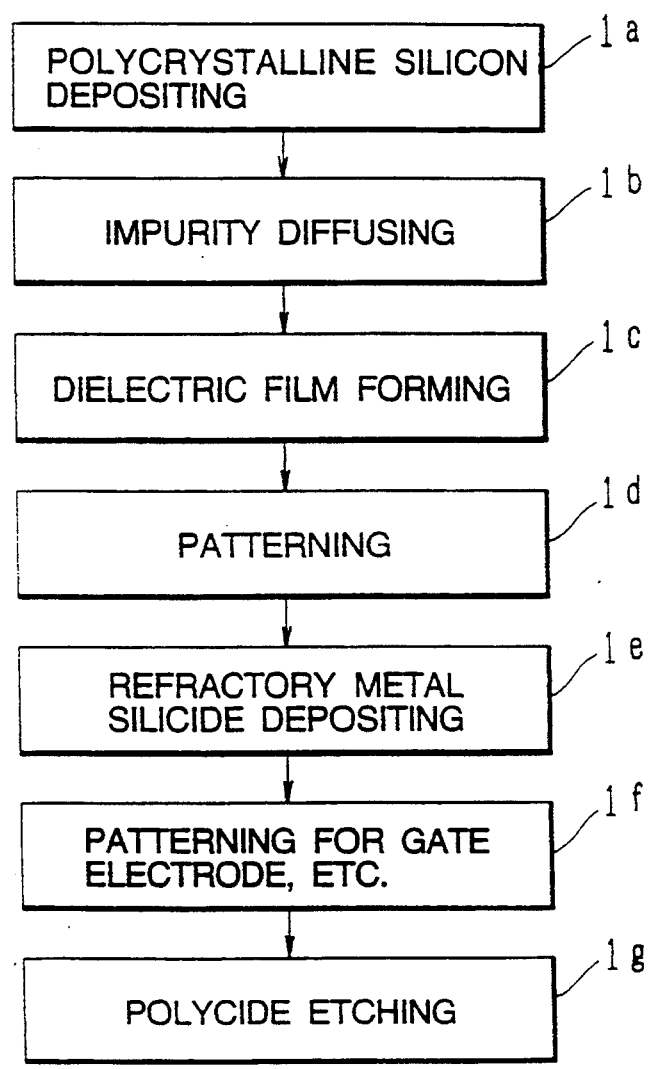
FIG. 1 is a flow chart explaining the steps of manufacturing a semiconductor device according to an embodiment of the present invention.
Figure 2:
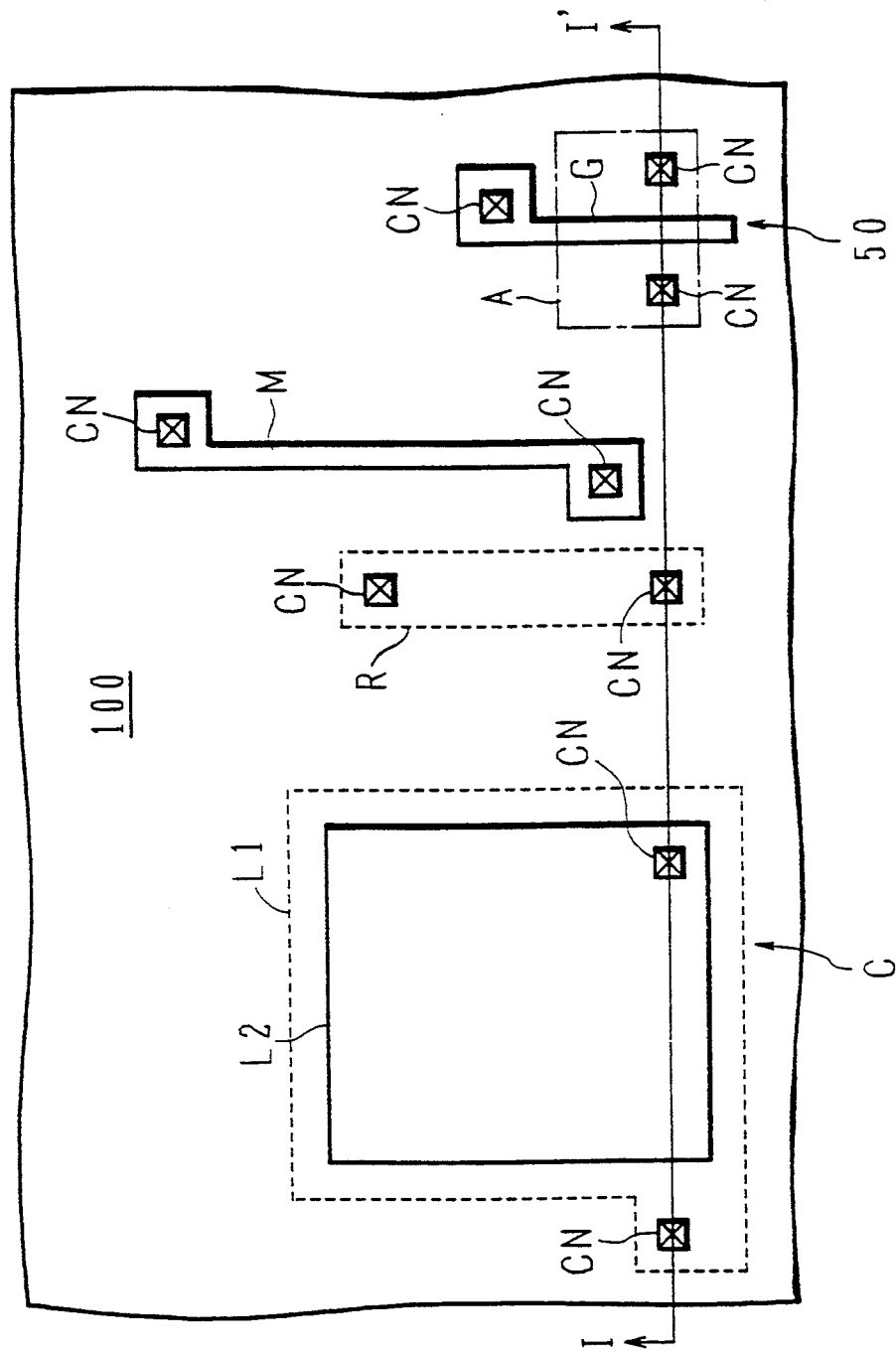
FIG. 2 is a plan view showing the structure of a semiconductor device manufactured by the steps shown in FIG. 1.

FIG. 1 is a flow chart explaining the steps of manufacturing an analog MOS integrated circuit according to an embodiment of the invention. This flow chart shows only the steps characteristic to the embodiment, and other manufacturing steps commonly used for a general MOS integrated circuit are omitted. FIG. 2 is a plan view illustratively showing the structure of an analog MOS integrated circuit manufactured by the steps shown in FIG. 1, a capacitor C, a resistor R, a metal wiring M, and a MOSFET 50 being shown formed on a semiconductor substrate 100. FIGS. 3 to 12 are cross sections taken along line I-I' of FIG. 2, illustrating the sequential steps of forming circuit elements corresponding to the steps 1a to 1g shown in FIG. 1. Each manufacturing step of this embodiment will be described in connection with FIGS. 1 to 12.

Figure 3:
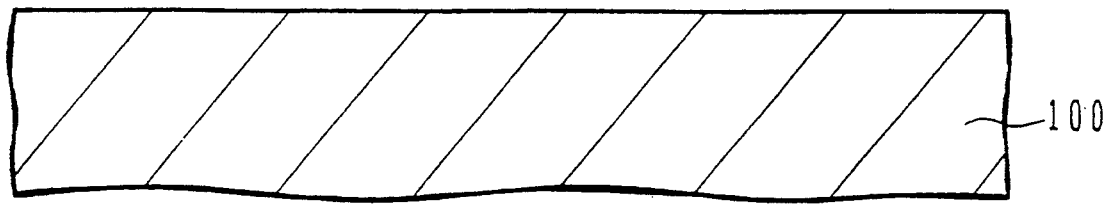
FIGS. 3 to 12 are cross sections taken along line I—I of FIG. 2, explaining the sequential steps of manufacturing a semiconductor device described with FIG. 1.
Figure 4:
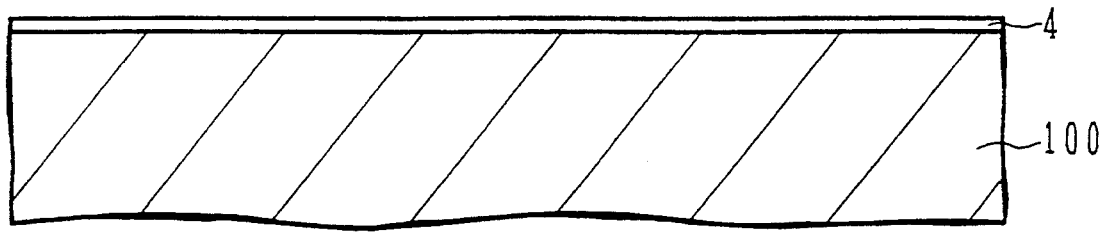
Figure 5:
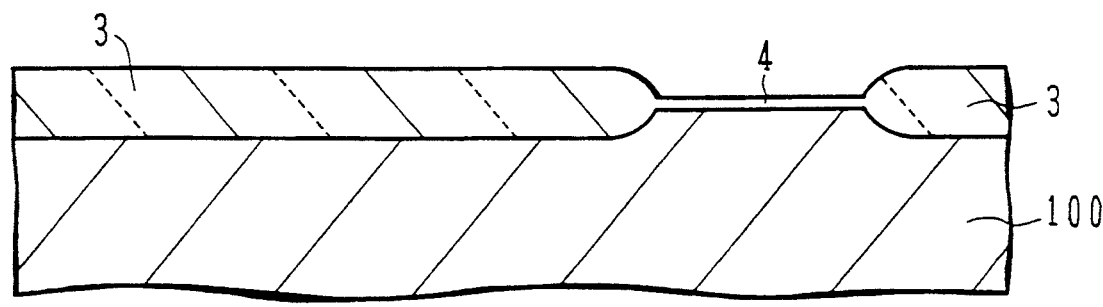

Referring to FIG. 3 to 5, a gate oxide film 4 is first formed on the surface of a semiconductor substrate 100 such as Si previously prepared (FIG. 3) to a predetermined film thickness (FIG. 4). Next, a film such as a nitride film for preventing a growth of an oxide film is formed on the surface of the gate oxide film 4. The nitride film is selectively removed to leave the area corresponding to the active region where a MOSFET is formed. A high temperature thermal oxidation process is performed to grow a thick field oxide film 3 at the area where the nitride film was removed. At the area where the nitride film covers the active region, the oxide film will not be grown to leave the thin gate oxide film 4 of which location is defined as the active region. After the growth of the field oxide film 3, the nitride film is completely removed (FIG. 5).

Figure 6:
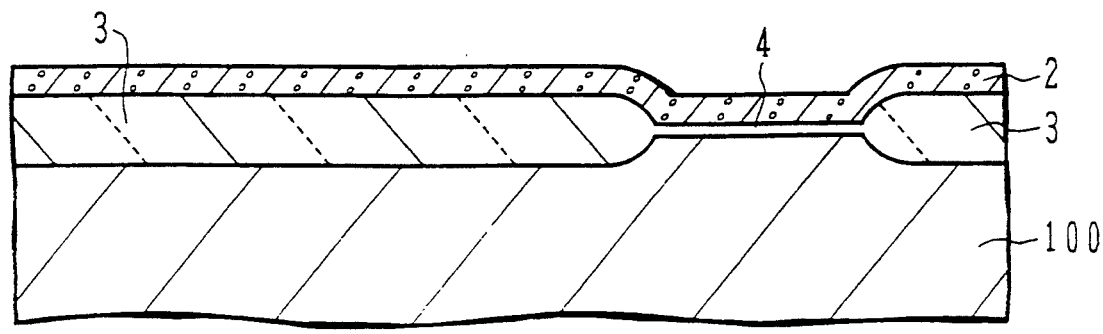
Figure 7:
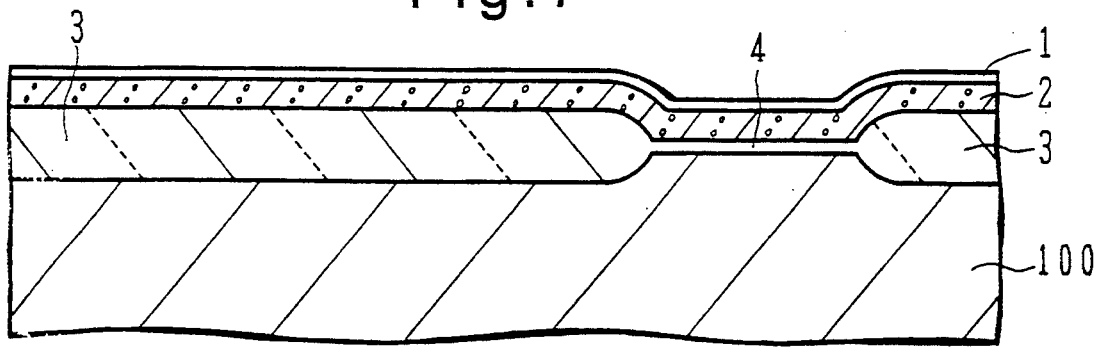

Next, referring to FIG. 1, at a polycrystalline silicon depositing step 1a, a polycrystalline silicon layer 2 is conformally deposited on the whole surface of the substrate as shown in FIG. 6. At the next impurity diffusing step 1b, impurities such as phosphor are uniformly diffused in the polycrystalline silicon layer 2. At the next step 1c for forming a dielectric film for a capacitor insulating film, a dielectric film 1 used as a capacitor insulating film is formed conformally on the surface of the polycrystalline silicon layer 2 (FIG. 7). This dielectric film 1 may be a single layer silicon oxide film or a laminated film such as a film made of a silicon nitride film and a silicon oxide film. The material and thickness of the dielectric film are selected so as to give a necessary capacitance C between capacitor electrodes.

Figure 8:
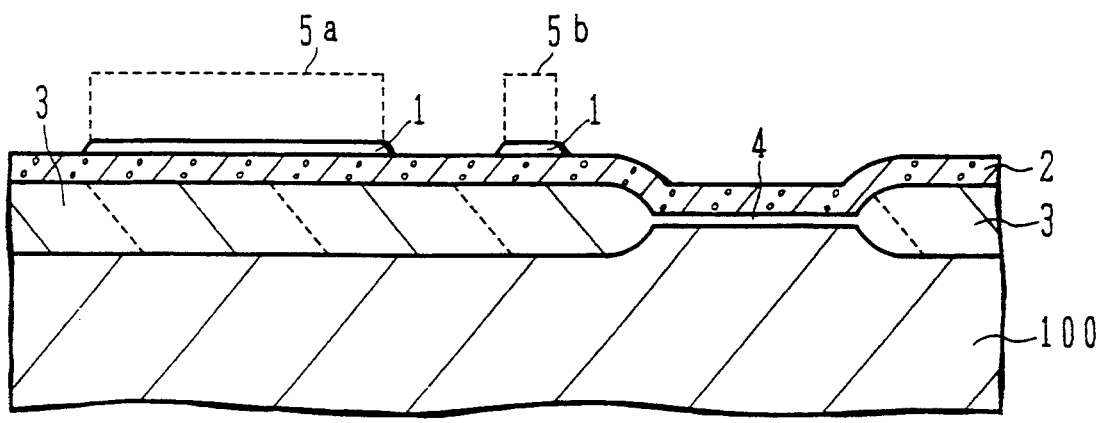

Next, at a patterning step 1d shown in FIG. 1, photoresist is coated on the surface of the capacitor insulating film 1. The photoresist is thereafter selectively removed through a development process while leaving unremoved the areas where a capacitor C and a resistor R are formed. Using the left photoresist as an etching mask, the dielectric film 1 is etched. The film 1 is therefore selectively removed while leaving unetched the areas where the capacitor C and resistor R are formed. As etching the dielectric film 1, the polycrystalline silicon layer 2 on which a MOSFET gate electrode is formed later is subjected to a surface treatment. It is therefore preferable to use an etching method which can keep the substrate clean and can provide a high etching selection ratio (of the capacitor insulating film to the polycrystalline silicon film). for example, if the dielectric film 1 is a laminated film having a silicon oxide lower layer, the upper layer is removed by dry etching, and the lower layer is removed by buffered hydrofluoric acid ($HF+NH_4F+(H_2O)$) or the like for stable etching. After etching the dielectric film 1 as shown in FIG. 8, photoresist 5a and 5b on the capacitor C and resistor R areas is removed. The remaining dielectric films define positions of the lower electrode of the capacitor and the resistor.

Figure 9:
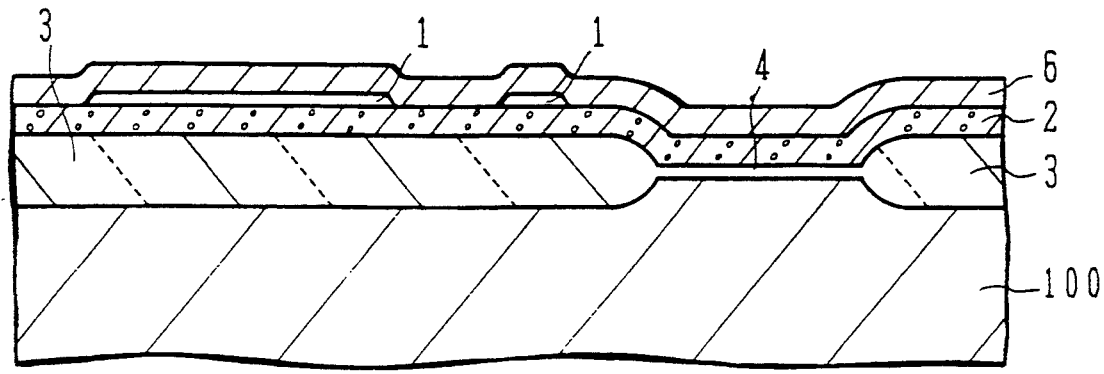

Next, at a refractory metal silicide layer depositing step 1e shown in FIG. 1, a refractory metal silicide layer 6 such as $WSi_x$ and $MoSi_x$ is deposited as shown in FIG. 9, covering conformally the polycrystalline silicon layer 2 and the dielectric film 1. If a thermal treatment is performed before the refractory metal silicide layer depositing step, the reliability of a finished capacitor C will be improved. Namely, not only the electrical and physical properties of the dielectric film can be improved because of the densification of the dielectric film, but also the refractory metal silicide layer can be prevented from being peeled off due to degaussing or stress change of the dielectric film layer when a thermal treatment is performed after the refractory metal silicide layer depositing step. Particularly, the contact between the retractory metal silicide layer 6 and dielectric film 1 becomes more tight. It is also possible to prevent the impurities in the polycrystalline silicon layer 2 from being diffused again.

After the deposition of the refractory metal silicide layer and before application of an interlayer insulating layer, the device is heated e.g. to about 1100° C. to lower the resistance value of the refractory metal silicide electrode and polycide electrode.

Figure 10:
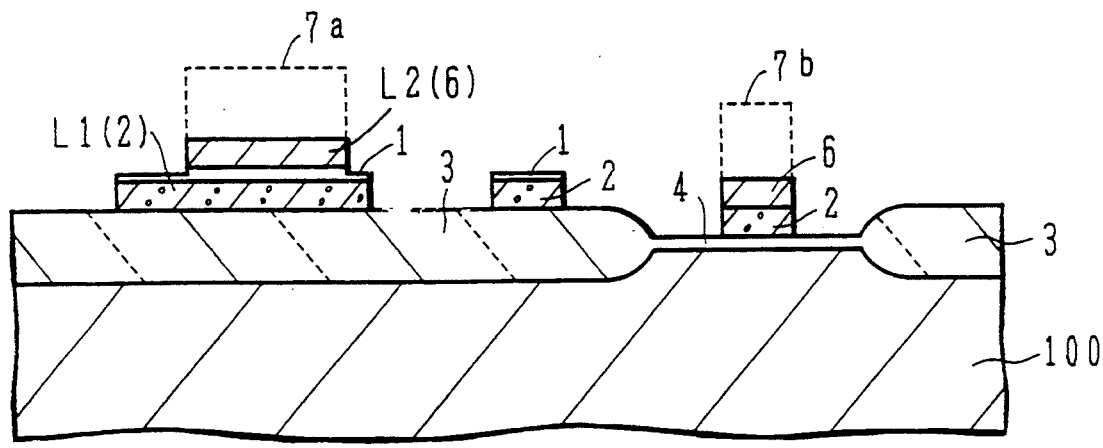

Next, a patterning step if for a gate electrode and the like shown in FIG. 1 is performed as illustrated in FIG. 10. First, photoresist is coated on the surface of the refractory material layer 6. The photoresist is selectively removed through a development process while leaving unremoved the areas where the upper electrode L2 of the capacitor C and the gate electrode G of MOSFET 50 are formed.

Next, at a polycide etching step 1g shown in FIG. 1, a general polycide etching process is performed by using the remaining photoresist as the etching mask. As a result, the refractory metal silicic layer 6 is selectively removed leaving only part of the refractory metal silicide layer 6 at the areas corresponding to the upper electrode L2 of the capacitor C and the gate electrode G of MOSFET 50 simultaneously. Also removed is the polycrystalline silicon layer 2 at the area not covered with the dielectric film 1. Because this dielectric film 1 operates as an etching stopper, the resistor R and the lower electrode L1 of the capacitor C can be automatically and simultaneously formed where the dielectric films 1 remain. After the polycide etching process, photoresist 7a and 7b on the refractory metal silicic layer is removed. As shown in FIG. 10, a silicide layer 6 is formed on the polycrystalline silicon layer 2 at the gate electrode G, forming a polycide electrode.

Figure 11:
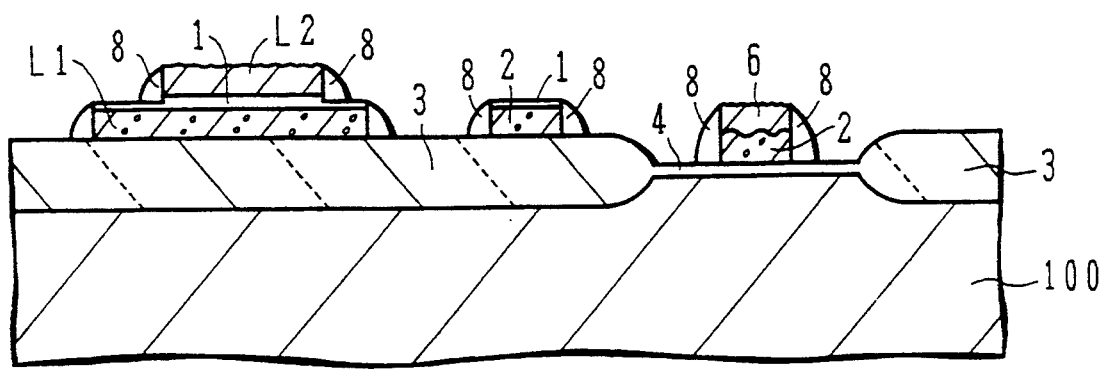
Figure 12:
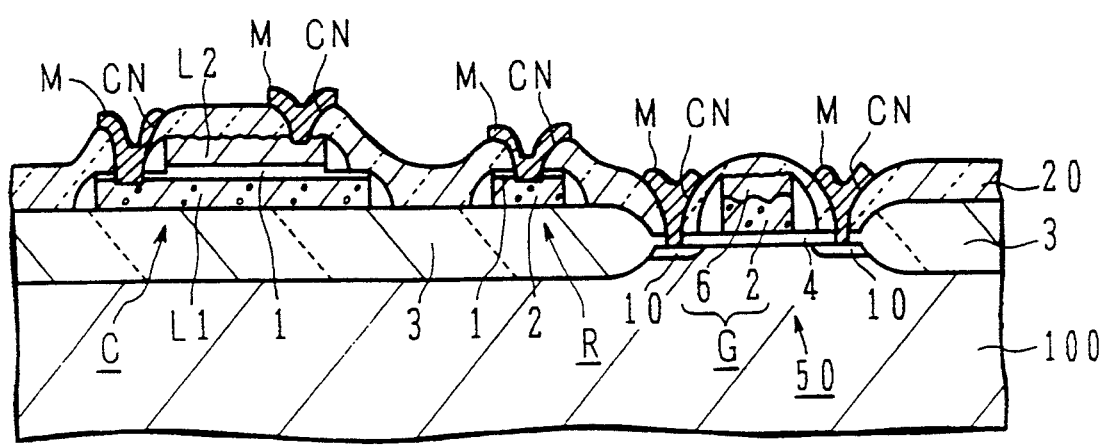

Next, processes similar to those commonly used for a general MOS integrated circuit are sequentially performed, including an ion implantation and thermal diffusion process for forming source and drain 10, 10, . . . , a process of forming an insulating interlayer 20, a process of forming electrode contact holes CN, a depositing and patterning process for a metal wiring M, and other processes. If a MOSFET of an LDD (lightly doped drain) structure is to be formed, side wall spacers 8, 8, . . . , are formed as shown in FIG. 11 after the polycide etching process by using an insulating film CVD method and a reactive ion etching method. A finished analog MOS integrated circuit has the sectional structure such as shown in FIG. 12.

As described above, because the capacitor C, resistor R, and gate electrode G are formed by the same process, the dynamic characteristics and optimum design of CMOS semiconductors and transistors can be reliably obtained. A capacitor C and resistor R of high precision can be formed easily at low cost and with a small number of steps.

Further, because the capacitor C, resistor R, and gate electrode G are formed by the same process, the high temperature thermal process is required only for forming the dielectric film serving also as an etching stopper at the dielectric film forming step 1c, so that the CMOS characteristics are less deteriorated. The thermal treatment for the dielectric film is performed before the ion implantation process for the LDD structure and before the ion implantation process at a high impurity concentration for source and drain. Therefore, even if a relatively high temperature thermal treatment is performed so as to improve the quality of the dielectric film, deteriorating the CMOS characteristics is relatively low.

If a process of etching back a CVD film (side wall forming process) is used for the LDD structure, the surface of the polycrystalline silicon layer as a resistor is slightly etched, resulting in a variation of resistance values. However, in the above-described embodiment, by properly setting the dielectric film 1, it can be used as the etching preventing mask and a resistor of high precision can be formed easily.

Since the dielectric film 1 used as the mask is sufficiently thin so that it is not required to be removed but may be left as part of an interlayer film without any trouble during manufacturing steps.

Further, because the gate electrode G has a polycide structure, there is less possibility of degrading the CMOS characteristics to be caused by impurity ions passed through a polycrystalline silicon single layer, and it is not necessary to change the manufacturing conditions.

Still further, the gate material wiring has also a polycide structure, retaining a low resistance condition and ensuring the high speed operation.

Because the gate electrode of the MOSFET is formed by the use of polycide (a composite layer of a polycrystalline silicon layer and a refractory metal silicide layer) and the polycrystalline silicon and refractory metal silicide layers constituting a polycide gate structure are respectively deposited as a lower and an upper electrode of a capacitor, separate manufacturing step or addition of steps for forming electrode of a capacitor can be dispensed with. Also, the step of depositing a polycrystalline silicon layer is concurrently used for depositing a polycrystalline silicon layer for resistors.

Thus, it becomes possible to avoid addition of a step for forming a resistors. Yet further, by depositing a dielectric film used in capacitors also on resistors for protecting the resistors, it becomes possible to avoid addition of a separate step for forming a protective film for the resistors.

The present invention has been described in connection with the above embodiments. The invention is not intended to be limited only to the embodiments, but it is apparent for those skilled in the art that various substitutions, changes, improvements, combinations, and the like are possible.

I claim:

1. A semiconductor integrated circuit comprising:
   a thin insulating film and a thick insulating film formed on the surface of a semiconductor substrate;
   a gate electrode formed on said thin insulating film, said gate electrode having a laminated structure of a polycrystalline silicon layer and a refractory metal silicide layer;
   a capacitor element formed on said thick insulating film, said capacitor element having a laminated structure of said polycrystalline silicon layer, a dielectric film, and said refractory metal silicide layer; and
   a resistor element formed on said thick insulating film, said resistor element having a laminated structure of said polycrystalline silicon layer and said dielectric film.

2. A semiconductor integrated circuit device according to claim 1, wherein said dielectric film is a silicon oxide film or a laminated layer of a silicon nitride film and a silicon oxide film.

3. A semiconductor integrated circuit device according to claim 1, wherein said refractory metal silicide layer comprises a substance from a group consisting of $WSi_x$ and $MoSi_x$.

4. A semiconductor device comprising:
   a semiconductor substrate having a gate region thereon and a field insulating film thereon;
   a field effect transistor formed in the gate region, the field effect transistor having a gate electrode comprising polycrystalline silicon and refractory metal silicide layers;
   a resistor element formed don the field insulating film, the resistor element comprising a polycrystalline silicon layer having a first thickness and a dielectric film having a second thickness thereon;
   a capacitor element formed on the film insulating film, the capacitor element comprising:
      a lower electrode layer comprising a polycrystalline silicon layer having a thickness identical to the first thickness of the resistor element;
      a dielectric layer having thick and thin portions, wherein the thin portion having a thickness identical to the second thickness of the dielectric film formed on the resistor element; and
      an upper electrode layer comprising a refractory metal silicide layer.

5. A semiconductor device according to claim 4, wherein the refractory metal silicide layer comprises a substance selected from a group consisting of $WSi_x$ and $MoSi_x$.

6. A semiconductor device according to claim 4, wherein the dielectric film and the dielectric layer comprises a silicon oxide film or a laminated layer of a silicon nitride film and a silicon oxide film.

7. A semiconductor device according to claim 4, wherein the gate electrode, the resistor element and the upper and lower electrode layers of the capacitor element have side wall spacers.

8. A semiconductor device according to claim 4, wherein the lower electrode electrically contacts metal wiring through the dielectric layer.

9. A semiconductor device according to claim 4, wherein the thin portion in the dielectric layer of the capacitor element corresponds to the lower electrode layer.

10. A semiconductor device according to claim 4, wherein the thick portion in the dielectric layer of the capacitor element corresponds to the upper electrode layer.

11. A semiconductor device formed on a semiconductor substrate having a gate region thereon and a field insulating film thereon comprising:
- a field effect transistor formed in the gate region, the field effect transistor having a gate electrode comprising polycrystalline silicon and refractory metal silicide layers;
- a first analog element formed on the field insulating film, the first analog element comprising a first conductive layer and a dielectric film thereon;
- a second analog element formed on the field insulating film, the second analog element comprising:
  - a lower electrode layer comprising a polycrystalline silicon layer coplanar to the top surface of the first conductive layer on the first analog element;
  - a dielectric layer having thick and thin portions, wherein the thin portion being coplanar to the dielectric film of the first analog element; and
  - an upper electrode layer comprising a refractory metal silicide layer.

12. A semiconductor device according to claim 11, wherein the first analog element is a resistor element and a second analog element is a capacitor element.

13. A semiconductor device according to claim 11, wherein the refractory metal silicide layer comprises a substance selected from a group consisting of $WSi_x$ and $MoSi_x$.

14. A semiconductor device according to claim 11, wherein the dielectric film and the dielectric layer comprises a silicon oxide film or a laminated layer of a silicon nitride film and a silicon oxide film.

15. A semiconductor device according to claim 11, wherein the edges of the thin portion in the dielectric layer of the second analog element corresponds to the lower electrode layer.

16. A semiconductor device according to claim 11, wherein edges of the thick portion in the dielectric layer of the second analog element corresponds to the upper electrode layer.

* * * * *